United States Patent
Chang et al.

(10) Patent No.: US 9,054,188 B2
(45) Date of Patent: Jun. 9, 2015

(54) CURVED WAFER PROCESSING ON METHOD AND APPARATUS

(75) Inventors: I-Ming Chang, ShinChu (TW);
Wen-Huei Guo, Chu-bei (TW);
Chih-Hao Chang, Chu-Bei (TW);
Shou-Zen Chang, Panchiao (TW);
Clement Hsingjen Wann, Carmel, NY (US); Tung Ying Lee, Hsin-Chu (TW);
Cheng-Long Chen, Hsin-Chu (TW);
Jui-Chien Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 254 days.

(21) Appl. No.: 13/404,819

(22) Filed: Feb. 24, 2012

(65) Prior Publication Data

US 2013/0224952 A1   Aug. 29, 2013

(51) Int. Cl.
| | | |
|---|---|---|
| *H01L 21/3205* | (2006.01) | |
| *H01L 21/683* | (2006.01) | |
| *H01L 21/687* | (2006.01) | |
| *H01L 21/31* | (2006.01) | |
| *H01L 29/78* | (2006.01) | |
| *H01L 29/10* | (2006.01) | |
| *H01L 29/66* | (2006.01) | |

(52) U.S. Cl.
CPC ....... *H01L 29/7845* (2013.01); *H01L 29/66545* (2013.01); *H01L 29/7847* (2013.01); *H01L 29/7848* (2013.01); *H01L 29/1054* (2013.01); *H01L 29/785* (2013.01)

(58) Field of Classification Search
CPC ............... H01L 29/1054; H01L 29/66545; H01L 29/7845; H01L 29/7847; H01L 29/785
See application file for complete search history.

(56) References Cited

U.S. PATENT DOCUMENTS

| | | | |
|---|---|---|---|
| 2005/0020094 A1* | 1/2005 | Forbes et al. | 438/784 |
| 2006/0038182 A1* | 2/2006 | Rogers et al. | 257/77 |
| 2007/0187683 A1* | 8/2007 | Forbes | 257/65 |
| 2009/0098665 A1* | 4/2009 | Bu et al. | 438/7 |

* cited by examiner

*Primary Examiner* — Seahvosh Nikmanesh
(74) *Attorney, Agent, or Firm* — Slater & Matsil, L.L.P.

(57) ABSTRACT

An apparatus for and a method of forming a semiconductor structure is provided. The apparatus includes a substrate holder that maintains a substrate such that the processing surface is curved, such as a convex or a concave shape. The substrate is held in place using point contacts, a plurality of continuous contacts extending partially around the substrate, and/or a continuous ring extending completely around the substrate. The processing may include, for example, forming source/drain regions, channel regions, silicides, stress memorization layers, or the like.

20 Claims, 8 Drawing Sheets

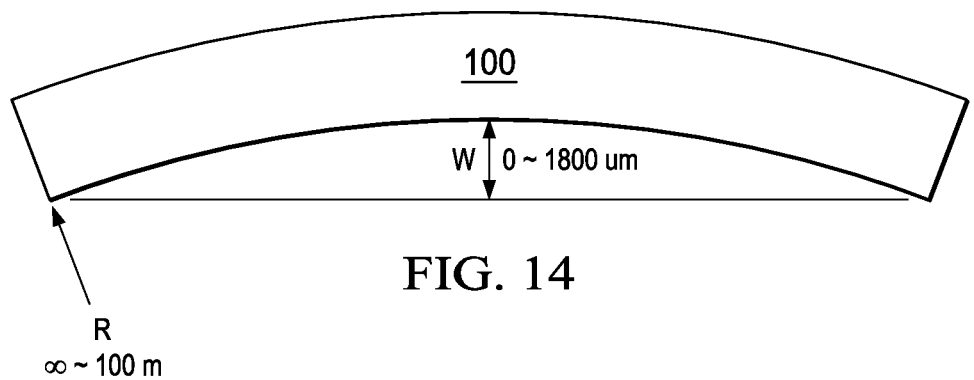
FIG. 14
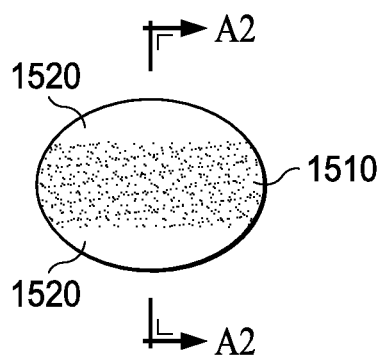
FIG. 15A1
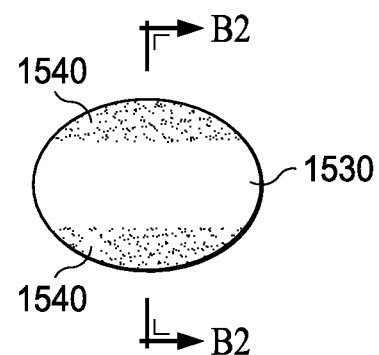
FIG. 15B1
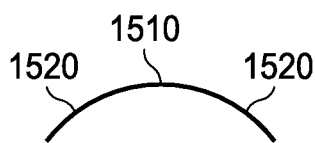
FIG. 15A2
FIG. 15B2

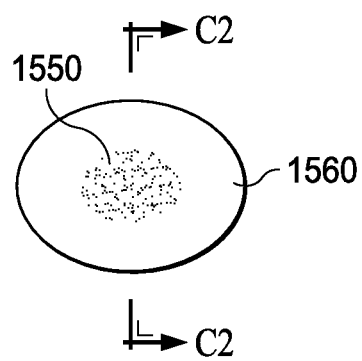
FIG. 15C1
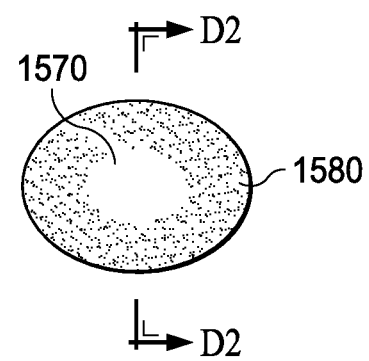
FIG. 15D1
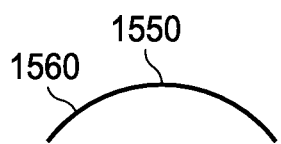
FIG. 15C2
FIG. 15D2

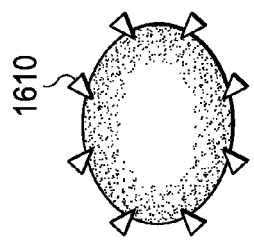 FIG. 16D1
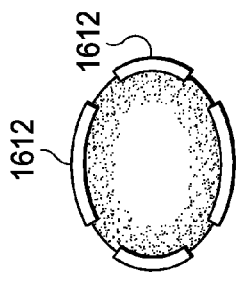 FIG. 16D2
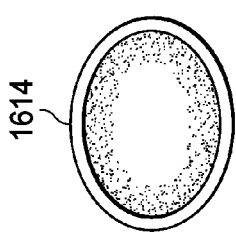 FIG. 16D3
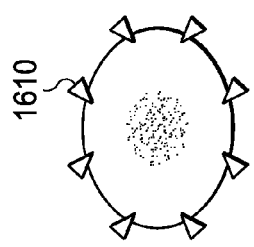 FIG. 16C1
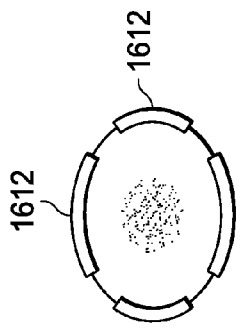 FIG. 16C2
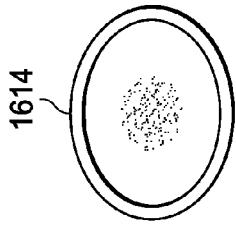 FIG. 16C3
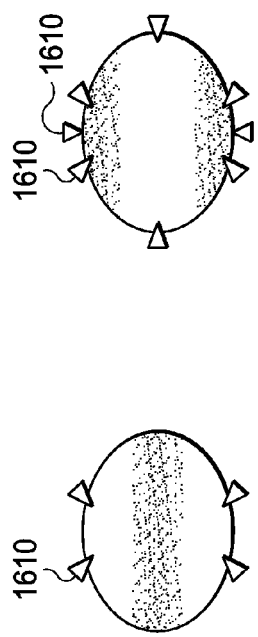 FIG. 16B1
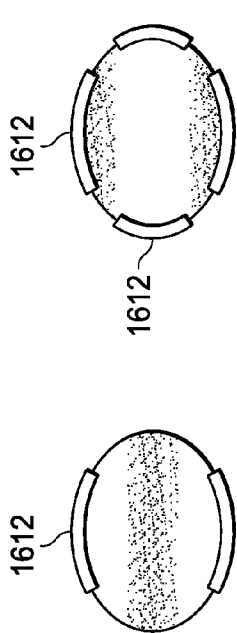 FIG. 16B2
FIG. 16B3
FIG. 16A1
FIG. 16A2
FIG. 16A3

CURVED WAFER PROCESSING ON METHOD AND APPARATUS

BACKGROUND

Reduction of the size and the inherent features of semiconductor devices (e.g., a metal-oxide semiconductor field-effect transistor) have enabled continued improvement in speed, performance, density, and cost per unit function of integrated circuits over the past few decades. In accordance with a design of the transistor and one of the inherent characteristics thereof, modulating the length of a channel region underlying a gate between a source and drain of the transistor alters a resistance associated with the channel region, thereby affecting performance of the transistor. More specifically, shortening the length of the channel region reduces a source-to-drain resistance of the transistor, which, assuming other parameters are maintained relatively constant, may allow an increase in current flow between the source and drain when a sufficient voltage is applied to the gate of the transistor.

To further enhance the performance of metal-oxide semiconductor (MOS) devices, stress may be introduced in the channel region of a MOS transistor to improve carrier mobility. Generally, it is desirable to induce a tensile stress in the channel region of an n-type metal-oxide-semiconductor (NMOS) device in a source-to-drain direction, and to induce a compressive stress in the channel region of a p-type metal-oxide-semiconductor (PMOS) device in a source-to-drain direction.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 14 illustrates a curvature of a processing surface in an embodiment;

FIGS. 15A1-15D2 illustrate different curvatures that may be used in various embodiments;

FIGS. 16A1-16E illustrate different types of holders that may be used in various embodiments.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use respective embodiments, and do not limit the scope of the present disclosure.

Figure 1:
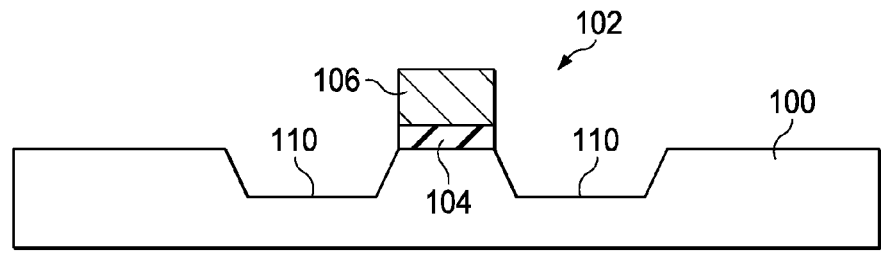
FIGS. 1-5 are cross-sectional views of intermediate stages in the manufacture of a device using a convex processing surface in an embodiment.

FIGS. 1-5 illustrate a method for fabricating a semiconductor device having a strained channel region in accordance with an embodiment. Referring first to FIG. 1, a substrate 100 having gate structure 102 formed thereon is shown in accordance with an embodiment. The substrate 100 may comprise bulk silicon, doped or undoped, or an active layer of a semiconductor-on-insulator (SOI) substrate. Generally, an SOI comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Other substrates, such as a multi-layered or gradient substrate may also be used. The substrate may alternatively be a Ge substrate, a SiGe substrate, a group III-V, II-VI substrate, or the like.

The gate structure 102 may comprise a gate insulator layer 104 and a gate electrode 106. The gate insulator layer 104 may be formed of a high-K dielectric material, such as silicon oxide, silicon oxynitride, silicon nitride, an oxide, a nitrogen-containing oxide, a combination thereof, or the like. Other examples of such materials include aluminum oxide, lanthanum oxide, hafnium oxide, zirconium oxide, hafnium oxynitride, or combinations thereof. Other embodiments may utilize spacers (not shown) formed alongside the gate structure to protect the gate structure during processing.

In an embodiment in which the gate insulator layer 104 comprises an oxide layer, the gate insulator layer 104 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. Other methods (e.g., ALD) and materials may be used.

The gate electrode 106 may comprise a conductive material, such as a metal (e.g., tantalum, titanium, molybdenum, tungsten, platinum, aluminum, hafnium, or ruthenium), a metal silicide (e.g., titanium silicide, cobalt silicide, nickel silicide, or tantalum silicide), a metal nitride (e.g., titanium nitride or tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrode is poly-silicon, the gate electrode 106 may be formed by depositing doped or undoped poly-silicon by low-pressure CVD (LPCVD).

The gate insulator layer 104 and the gate electrode 106 may be patterned by photolithography techniques. Generally, photolithography involves depositing a photoresist material, which is then masked, exposed, and developed. After the photoresist mask is patterned, an etching process may be performed to remove unwanted portions of the gate dielectric material and the gate electrode material to form the gate structure 102 as illustrated in FIG. 1. In an embodiment in which the gate electrode material is poly-crystalline silicon and the gate dielectric material is an oxide, the etching process may be a wet or dry, anisotropic or isotropic, etch process.

FIG. 1 further illustrates recesses 110 formed on opposing sides of the gate structure 102. As discussed in greater detail below, a stress-inducing layer will be epitaxially grown along the bottom of the recesses 110. In an embodiment, the recesses 110 may be etched by, for example, $HBr/O_2$, $HBr/Cl_2/O_2$, or $SF_6/Cl_2$ plasma. One skilled in the art will realize that the dimensions provided throughout the description are merely examples, and the dimensions may vary with the scaling of the technology used for forming the integrated circuits.

Figure 2:
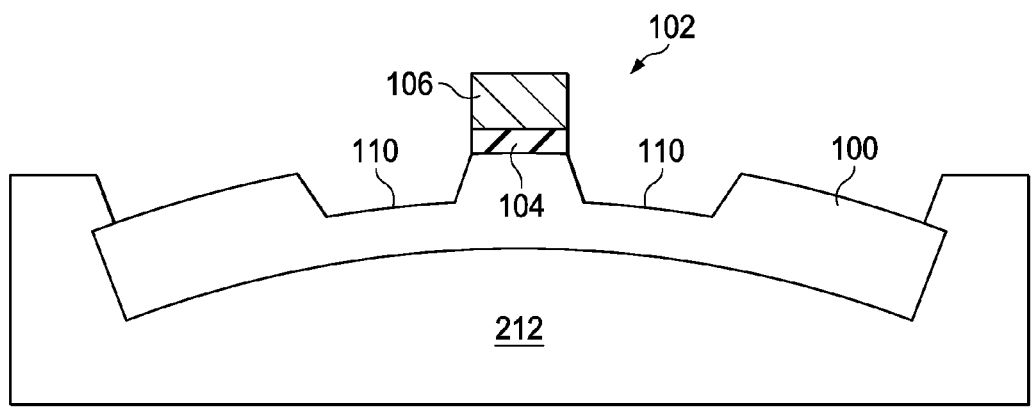

Referring now to FIG. 2, there is shown the substrate 100 attached to a substrate holder 212 in accordance with an embodiment. The holder 212 is configured to hold a substrate, such as the substrate 100, such that a surface of the substrate is curved. For example, in the embodiment illustrated in FIG. 2, the holder 212 clasps the substrate 100 such that a processing surface of the substrate 100 exhibits a convex shape. In this manner, the width of the recesses 110 increases. As explained in greater detail below, an epitaxial layer will be grown in these recesses while the recesses are expanded. After the epitaxial layer is grown, the substrate is released from the holder, allowing the substrate 100 to return to, or near to, the original shape of the substrate 100, e.g., return to planar or near-planar.

Figure 3:
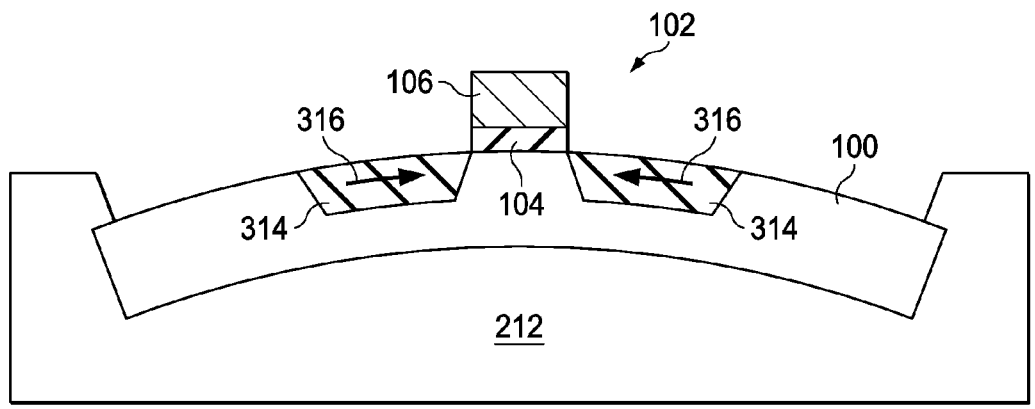

FIG. 3 illustrates the formation of stress-inducing regions 314 along the bottoms of the recesses 110. The material of the stress-inducing regions 314 is selected such that a lattice mismatch exists between the material of the stress-inducing regions 314 and the material of the substrate 100. One of ordinary skill in the art will also appreciate that the type of materials may be varied depending upon the type of device being formed. For example, in forming a PMOS device using a silicon substrate, the stress-inducing regions 314 may be formed of SiGe, which has a larger lattice structure than the silicon substrate. The lattice structure of the SiGe stress-inducing regions 314 causes a compressive stress, indicated by arrows 316, in the channel region, thereby increasing the hole mobility. SiGe stress-inducing regions 314 may be epitaxially grown in a selective epitaxial growth (SEG) process such as CVD using Si-containing gases and Ge-containing gases, such as $SiH_4$ and $GeH_4$, respectively, as precursors. Masks may be used to limit the epitaxial growth regions.

Figure 4:
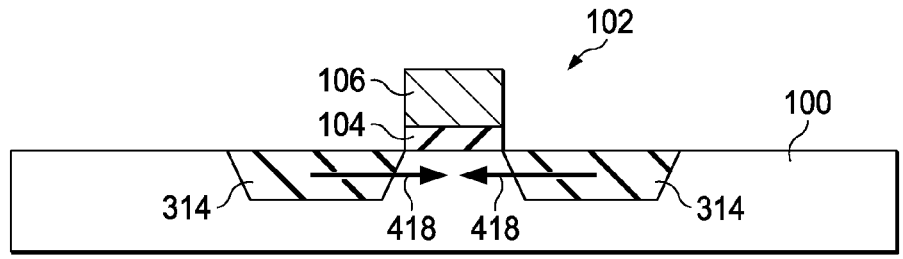

When released, the stress-inducing regions 314 may exert a compressive stress in the channel region greater than that obtained using similar processes and materials on a planar wafer, at least partially due to the epitaxial growth on the curved surface increasing the volume of the recesses. The larger compressive stress is indicated in FIG. 4 by larger arrows 418, as compared to the smaller compressive stress indicated by the smaller arrows 316 in FIG. 3.

Figure 5:
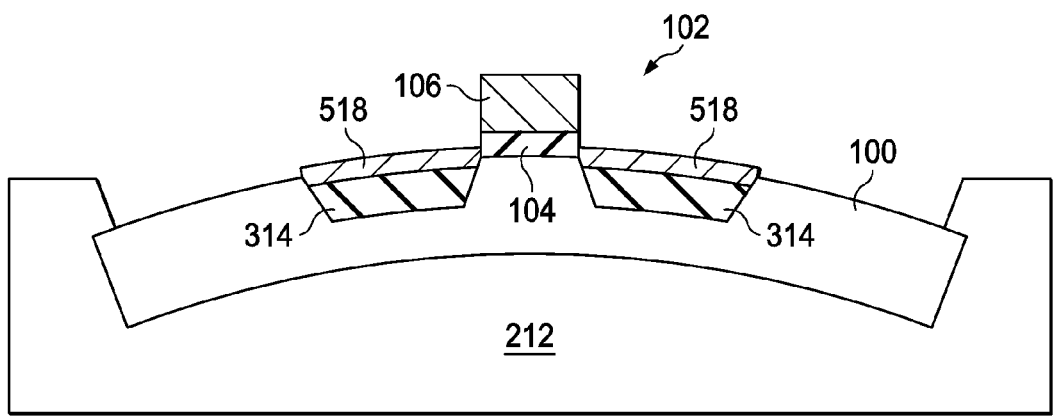

FIG. 5 illustrates formation of silicide regions 518 in accordance with an embodiment. The embodiment illustrated in FIG. 5 may be used individually or with other embodiments within the scope of the current disclosure. Similar to the formation of the stress-inducing regions 314 discussed above with reference to FIG. 3, the formation of the silicide regions 518 may also be performed while the surface of the substrate 100 is in a curved configuration. Generally, the silicide regions 518 may be formed to decrease contact resistance between the source/drain regions and contact vias extending through an overlying dielectric layer. The silicide regions 518 may be formed by blanket depositing a thin layer of metal, such as nickel, platinum, cobalt, and combinations thereof and annealing, such as a rapid thermal anneal, thereby causing the silicon to react with the metal where contacted. After the reaction, a layer of metal silicide is formed. The unreacted metal may then be removed. It is believed that forming the silicide regions 518 while the substrate 100 is in a curved configuration helps reduce or avoid stress relaxation of the channel region during processing. In an embodiment, the silicide region 518 may be formed after the processing illustrated in FIG. 3 and before releasing the substrate 100 illustrated in FIG. 4. Other processes, such as implant or anneal processes, may also be performed while the surface of the substrate 100 is in a curved configuration.

Figure 6:
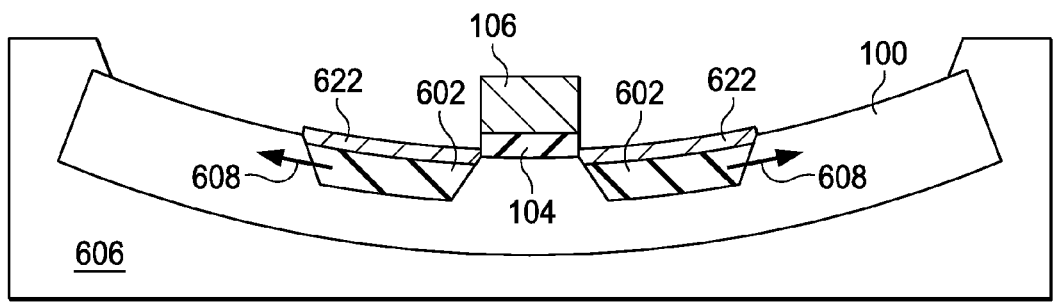
FIGS. 6 and 7 are cross-sectional views of intermediate stages in the manufacture of a device using a concave processing surface in an embodiment.
Figure 7:
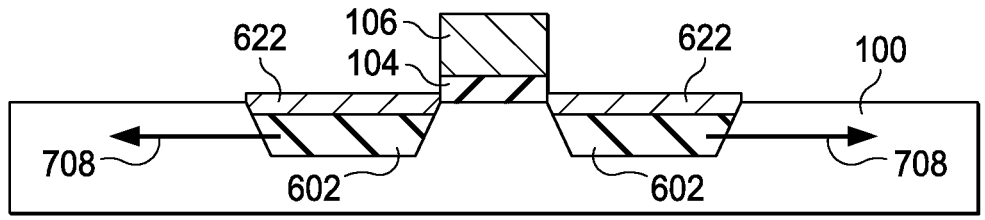

FIGS. 6 and 7 illustrate embodiments similar to those discussed above with reference to FIG. 5, except that the embodiments disclosed in FIGS. 6 and 7 utilize a concave processing surface. As noted above, the embodiments discussed above utilizing a convex processing surface may be particularly useful in designing PMOS. For NMOS devices, similar techniques may be utilized wherein a concave processing surface is utilized.

For example, FIG. 6 illustrates an embodiment similar to that illustrated in FIG. 5 in that stress-inducing regions 602 are formed in recesses in source/drain regions of a substrate 100 while the substrate 100 is in a curved configuration, except that the embodiment illustrated in FIG. 6 exhibits a concave processing surface. The substrate 100 may be placed in a holder 606 for processing. In this example, when the substrate 100 comprises a silicon substrate, stress-inducing regions 602 may be formed of SiC, which has a smaller lattice structure than the silicon substrate 100. The lattice structure of the SiC stress-inducing regions 602 causes a tensile stress (indicated in FIG. 6 by arrows 608) in the channel regions, thereby increasing the electron mobility. SiC stress-inducing regions 602 may be epitaxially grown in a SEG process such as CVD using Si-containing gases, such as $SiH_4$, and C-containing gases, such as $C_2H_4$ or $C_2H_6$, as precursors.

FIG. 6 also illustrates an embodiment in that silicide regions 622 are formed while the substrate 100 is in a curved configuration, except that the embodiment illustrated in FIG. 6 exhibits a concave processing surface. The silicide regions 622 may be formed in a similar manner as discussed above with reference to FIG. 5.

FIG. 7 illustrates the substrate 100 from FIG. 6 after the substrate 100 has been released. As indicated by arrows 708, the stress-inducing regions 602 exert a tensile stress in the channel region greater than that obtained using similar processes and materials on a planar wafer, at least partially due to the epitaxial growth on the curved surface decreasing the volume of the recesses.

In some embodiments, the holders 212 (see FIG. 2) and 606 (see FIG. 6) may comprise a vacuum to help secure the wafer. Embodiments including a vacuum may be desirable wherein a concave processing surface is to be formed such that the vacuum may draw and hold a region of the substrate lower than surrounding regions.

Additionally, the holders 212 and 606 are illustrated as being continuous solid pieces for illustrative purposes only. In other embodiments, the holders 212 and 606 may comprise ridges, posts, stands, or the like upon which a wafer may rest. Collectively, the ridges, posts, stands, or the like may provide a support surface having a convex or concave shape as discussed above. The holder may further accommodate heating structures, cooling structures, or the like.

Figure 8:
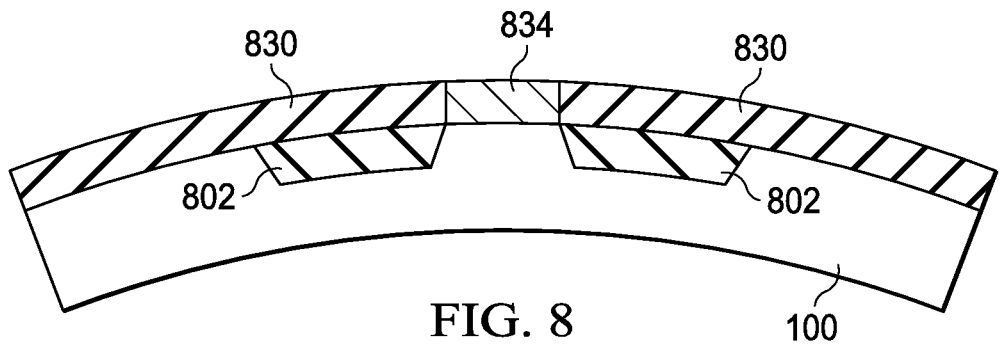
FIG. 8 is a cross-sectional view of an intermediate stage in the manufacture of a device using a convex processing surface in an embodiment.
Figure 9:
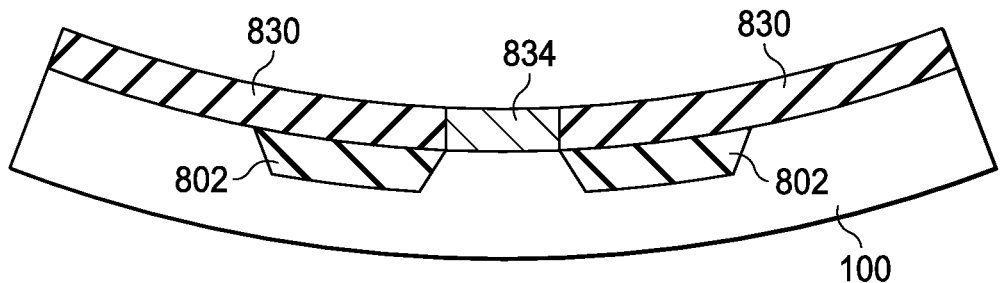
FIG. 9 is a cross-sectional view of an intermediate stage in the manufacture of a device using a concave processing surface in an embodiment.

FIGS. 8 and 9 illustrate other embodiments in which a curved processing surface may be utilized. The configurations illustrated in FIGS. 8 and 9 provide an example in which embodiments may be utilized with replacement gate (RPG) processing techniques. Generally, RPG processing techniques involve forming a transistor utilizing a dummy gate structure. The dummy gate structure is then removed and replaced with another gate structure.

Referring first to FIG. 8, there is shown the substrate 100 having a convex processing surface with a patterned layer 830 formed thereon. Source/drain regions 802 may be formed in the substrate 100. The patterned layer 830 may be formed by forming a dummy gate electrode and forming a dielectric layer adjacent to the dummy gate electrode such that the dummy gate electrode is exposed. The dummy gate electrode may then be removed, and the substrate placed in a configuration such that the processing surface of the substrate is convex as illustrated in FIG. 8. The opening left by the dummy gate electrode may be filled with, for example, a metallic material 834.

Excess material, if any, may be removed. In an embodiment, the substrate 100 is released and returned to a planar or near planar configuration, and thereafter, excess metallic material may be removed using, for example, a CMP process or a wet etch.

It is believed that devices formed using processes such as those discussed above may be useful in forming NMOS devices due to higher tensile stress created in the channel region.

FIG. 9 illustrates an RPG process using a concave processing surface of a substrate 100, which may be useful for forming a PMOS device. Similar materials, techniques, and processes as those discussed above with reference to FIG. 8 may be used in this embodiment, wherein like reference numerals refer to like elements, except that the processing surface of the substrate 100 exhibits a concave shape rather than a convex shape.

Figure 10:
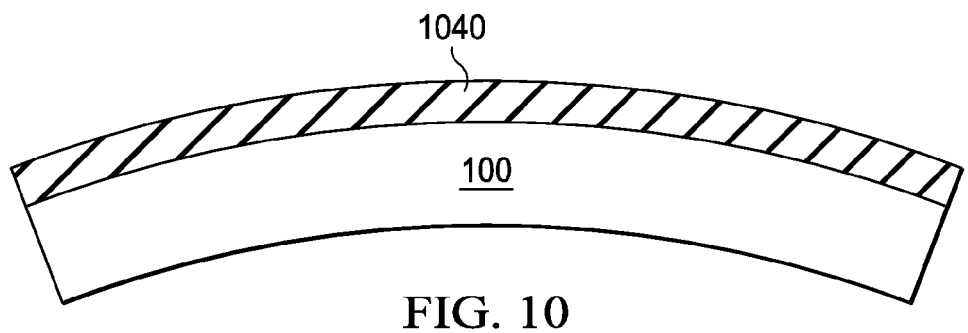
FIG. 10 is a cross-sectional view of an intermediate stage in the manufacture of a device using a convex processing surface in an embodiment.
Figure 11:
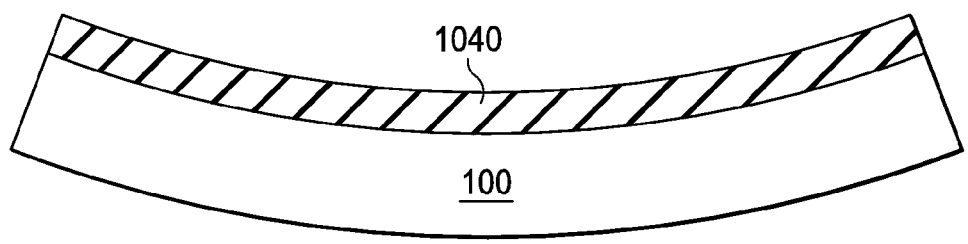
FIG. 11 is a cross-sectional view of an intermediate stage in the manufacture of a device using a concave processing surface in an embodiment.

FIGS. 10 and 11 illustrate yet other embodiments in which a convex or concave surface is utilized in combination with a stress memorization layer. Generally, a stress memorization layer is a layer having a different lattice structure than the underlying structures, such as the substrate, gate electrodes, or the like. The stress memorization layer is applied to the surface and an anneal process is performed, thereby causing the underlying structures to "memorize" the stress imparted by the stress memorization layer.

Referring first to FIG. 10, there is shown the substrate 100 having a convex processing surface with a stress memorization layer 1040 formed thereon. The stress memorization layer 1040 may be blanket formed, before or after a convex processing surface is formed. The stress memorization layer 1040 may be a single layer, such as a single layer of nitrides, oxynitrides, TEOS, other materials with internal stresses, or the like, or a plurality of layers, such as a layer of an oxide and a layer of a nitride. The stress memorization layer 1040 may be formed by, for example, LPCVD, plasma enhanced chemical vapor deposition, or the like. The stress memorization layer may be removed after performing an anneal. Embodiments such as that illustrated in FIG. 10 may be particularly useful in fabricating, for example, NMOS devices.

FIG. 11 illustrates a stress memorization process using a concave processing surface of the substrate 100, which may be useful for forming, for example, a PMOS device. Similar materials, techniques, and processes as those discussed above with reference to FIG. 10 may be used in this embodiment, wherein like reference numerals refer to like elements, except that the processing surface of the substrate 100 exhibits a concave shape rather than a convex shape.

Figure 12:
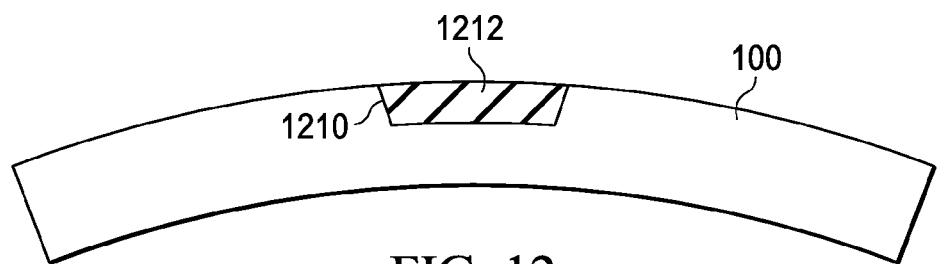
FIG. 12 is a cross-sectional view of an intermediate stage in the manufacture of a device using a convex processing surface in an embodiment.
Figure 13:
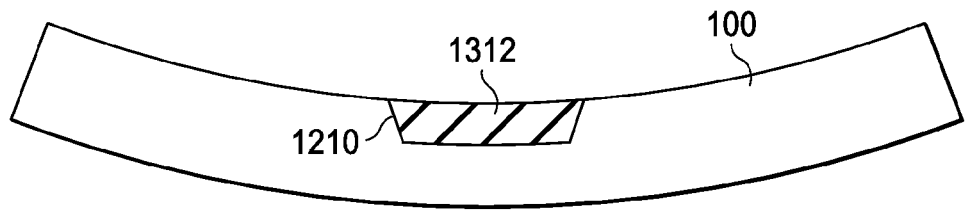
FIG. 13 is a cross-sectional view of an intermediate stage in the manufacture of a device using a concave processing surface in an embodiment.

FIGS. 12 and 13 illustrate yet other embodiments in which a convex or concave processing surface is utilized in formation of a fully strained channel (FSC). Referring first to FIG. 12, a stress-inducing region 1212 is formed in a recess of a substrate 100. The recess and the stress-inducing regions 1212 may be formed in a similar manner as discussed above with reference to FIGS. 1-4, except whereas FIGS. 1-4 formed recesses in the source/drain regions, the embodiment illustrated in FIG. 12 forms the recess 1210 in the channel region. The material of the stress-inducing region 1212 is selected such that a lattice mismatch exists between the material of the stress-inducing region 1212 and the material of the substrate 100. In an embodiment in which a PMOS device using a silicon substrate is being formed, the stress-inducing region 1212 may be formed of SiGe. When released, the stress-inducing region 1212 may exert a compressive stress in the channel region greater than that obtained using similar processes and materials on a planar wafer, at least partially due to the epitaxial growth on the curved surface increasing the volume of the recesses. Embodiments may be applied to planar MOS technology or fin technology (e.g., FinFET).

FIG. 13 illustrates a similar embodiment as that illustrated in FIG. 12, except a concave processing surface is utilized rather than a convex processing surface. In particular, FIG. 13 illustrates the substrate 100 having a stress-inducing region 1312 formed in a recess. In an embodiment in which an NMOS device is being formed and the substrate 100 comprises a silicon substrate, the stress-inducing region 1312 may be formed of SiC, which has a smaller lattice structure than the silicon substrate 100, thereby causing a tensile stress in the channel regions. The SiC stress-inducing region 1312 may be epitaxially grown in a SEG process such as CVD using Si-containing gases, such as $SiH_4$, and C-containing gases, such as $C_2H_4$ or $C_2H_6$, as precursors. When released, the stress-inducing region 1312 may exert a tensile stress in the channel region greater than that obtained using similar processes and materials on a planar wafer, at least partially due to the epitaxial growth on the curved surface increasing the volume of the recesses. The stress-inducing region 1312 may also be formed of Si on SiGe bilayer or other III-V material or its multilayer. Embodiments may be applied to planar MOS technology or fin technology (e.g., FinFET).

FIG. 14 illustrates a curvature that may be used in the embodiments discussed above, in accordance with an embodiment. As shown, the substrate 100 may have a curvature having a radius of about 100 m to infinity. In an embodiment in which the substrate 100 comprises a 300 mm wafer, the radius results in the substrate 100 having a curvature width W of about 0 μm to about 1800 μm, as illustrated in FIG. 14. This curvature width W may be an amount of curvature for either a concave processing surface or a convex processing surface. Other wafer sizes, such as a 450 mm wafer, may also be used.

FIGS. 15A1-15D2 illustrate various topography patterns that may be applied to a processing surface of a substrate, wherein darker regions represent regions having a higher topography than lighter regions. Accordingly, FIGS. 15A1 and 15A2, wherein FIG. 15A2 is a cross-sectional view along the A2-A2 line of FIG. 15A1, represent a topography in which a horizontal center band 1510 is higher than upper and lower horizontal bands 1520, thereby creating a convex processing surface along the A2-A2 line. FIGS. 15B1 and 15B2, wherein FIG. 15B2 is a cross-sectional view along the B2-B2 line of FIG. 15B1, illustrates a reverse of FIG. 15A, wherein a horizontal center band 1530 is lower than upper and lower horizontal bands 1540, thereby creating a concave processing surface along the B2-B2 line. FIGS. 15C1 and 15C2, wherein FIG. 15C2 is a cross-sectional view along the C2-C2 line of FIG. 15C1, represent a topography in which a center region 1550 is higher than a surrounding region 1560, thereby creating a convex processing surface. FIGS. 15D1 and 15D2, wherein FIG. 15D2 is a cross-sectional view along the D2-D2 line of FIG. 15D1, represent a topography in which a center region 1570 is lower than a surrounding region 1580, thereby creating a concave processing surface.

FIGS. 16A1-16D3 represent various types of holders that may be used. It should be noted that the type of holder may be varied dependent upon the topography being used. For example, FIGS. 16A1-16A3 correspond to types of holders that may be used, for example, with the topography illustrated in FIG. 15A; FIGS. 16B1-16B3 correspond to types of holders that may be used, for example, with the topography illustrated in FIG. 15B; FIGS. 16C1-16C3 correspond to types of holders that may be used, for example, with the topography illustrated in FIG. 15C; and FIGS. 16D1-16D3 correspond to types of holders that may be used, for example, with the topography illustrated in FIG. 15D.

FIGS. 16A1, 16B1, 16C1, and 16D1 represent holders utilizing point contacts, such as point contacts 1610. Embodiments utilizing topography ring such as FIGS. 16C1 and 16D1 may utilize more point contacts 1610 than embodiments utilizing bands such as FIGS. 16A1 and 16B1.

FIGS. 16A2, 16B2, 16C2, and 16D2 illustrate holders utilizing contact bands 1612. As seen in FIGS. 16C2 and 16D2 that utilize peripheral topography rings extending along a perhiphery having a different topography than a center region, contact bands 1612 may be utilized along both axis (e.g., horizontal and vertical) as compared to embodiments illustrated in FIGS. 16A2 and 16B2. FIG. 16B2 illustrates an embodiment in which contact bands 1612 are utilized along the horizontal axis with a topography varying only along the vertical axis.

FIGS. 16A3, 16B3, 16C3, and 16D3 represent holders comprising contact rings extending completely around the substrate.

Figure 16E:

FIG. 16E illustrates yet another type of holder in accordance with an embodiment. In this embodiment, a pull force is applied by the holder. This type of pull force may be applied individually or in combination with another type of holder, such as those discussed above. Embodiments such as these may be used to form NMOS or PMOS devices. For example, a pull force may be used to form the RPB for an NMOS device, while a pull force may be used to form epitaxial layers in the source/drain regions or the channel region (e.g., FSC) for a PMOS device.

The holders discussed above may be used to mount a wafer onto. The holder may then be placed into one or more process chambers. In an embodiment, a cluster chamber tool may be used. Generally a cluster tool includes a plurality of process chambers interconnected with a buffer chamber. The process chambers may perform similar processing or each process chambers may perform different processing. For example, the processing chambers may be configured to perform epitaxial growth, annealing, silicidation, nitridation, CVD, PVD, and the like. Interconnected to the buffer chamber may be one or more loadlock chambers. The buffer chamber and the one or more loadlock chambers permit transferring one or more wafers between the process chambers without breaking vacuum between processes or chambers.

The cluster tool may optionally further include a front-opening unified pod (FOUP) docking system and a factory interface. The FOUP docking system and the factory interface allow wafers to be loaded and unloaded without exposing the loadlock chambers, the buffer chamber, and the process chambers to air. In operation, wafers are transferred into and out of the cluster tool, either individually or in batches, via the FOUP docking system. The wafers are transferred from the FOUP docking system to the loadlock chamber via the factory interface. Once transferred into the loadlock chambers, the wafers are isolated from the ambient environment. The wafers are transferred to one or more of the process chambers.

In an embodiment, the wafer and the holder are inserted via the FOUP docking system. The wafer mounted on the holder may then be transferred to one or more of the process chambers.

Figure 17A:
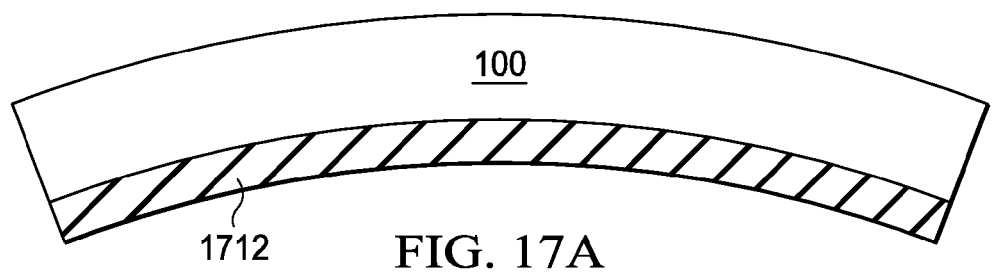
FIGS. 17A-17B illustrate a use of a stress film to form a curved processing surface.
Figure 17B:
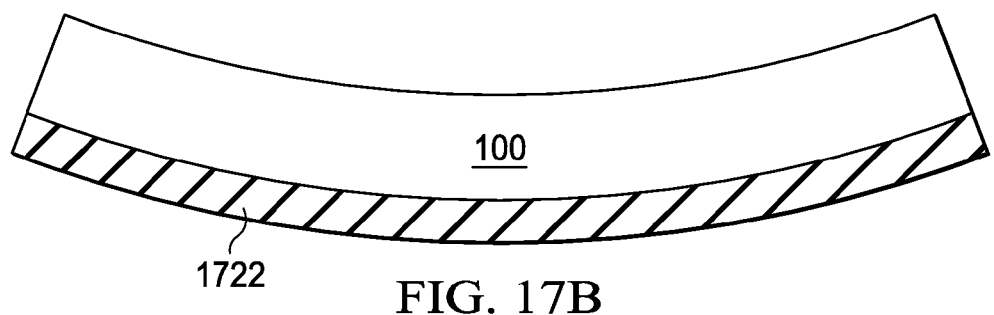

FIGS. 17A and 17B illustrate another method of forming a non-planar work surface in accordance with other embodiments. Referring first to FIG. 17A, there is shown the substrate 100 having a compressive stress film 1712 applied to the backside of the substrate. The compressive stress film 1712 acts to create a convex processing surface along an opposing surface of the substrate 100. After processing is completed, the compressive stress film 1712 may be removed, thereby allowing the substrate 1710 to return to planar or near-planar.

In an embodiment, the compressive stress film 1712 may be formed of SiGe, SiGeN, nitride, oxide, oxynitride, combinations thereof, and the like, formed by a CVD process, a PVD process, an ALD process, or the like. In an embodiment, the compressive stress film 1712 has a thickness of about 10 nm to about 1000 nm, exerting a compressive stress from about 0.1 GPa to about 20 GPa.

Referring now to FIG. 17B, there is shown the substrate 100 having a tensile stress film 1722 formed along a backside thereof. In this embodiment, the tensile stress film 1722 is utilized to form a concave processing surface. In an embodiment, the tensile stress film 1722 may be formed of SiN, oxide, oxynitride, SiC, SiCN, Ni silicide, Co silicide, combinations thereof, and the like, formed by a CVD process, a PVD process, an ALD process, or the like. In an embodiment, the tensile stress film 1722 has a thickness of about 10 nm to about 1,000 nm, exerting a compressive stress from about 0.1 GPa to about 20 GPa. The tensile stress film 1722 may be removed after processing, thereby allowing the substrate 1710 to return to planar or near-planar.

In an embodiment, a method of forming a semiconductor structure is provided. The method comprises providing a substrate, curving a processing surface of the substrate, and processing the substrate while the processing surface is curved.

In another embodiment, a method of forming a semiconductor structure is provided. The method comprises providing a substrate comprising a processing surface such that the processing surface of the substrate has a first curvature. The substrate is placed in a holder that is configured to maintain the substrate such that the processing surface exhibits a second curvature, the second curvature having a smaller radius than the first curvature. Thereafter, one or more process steps are performed on the processing surface of the substrate. The substrate is removed from the holder, wherein upon removing the processing surface of the substrate exhibits a third curvature, the third curvature having a greater radius than the second curvature. One or more additional processes may be performed on the substrate.

In yet another embodiment, a substrate holder is provided. The holder comprises one or more wafer support surfaces, the one or more wafer support surfaces collectively being non-planar and one or more connectors configured to hold a wafer on the wafer support surfaces.

Although the present disclosure and its advantages have been described in detail, it should be understood that various changes, substitutions and alterations can be made herein without departing from the spirit and scope of the disclosure as defined by the appended claims. For example, different types of materials and processes may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor structure, the method comprising:
    providing a substrate;
    forming a recess in a processing surface of the substrate;
    curving the processing surface of the substrate;
    processing the substrate while the processing surface is curved, the processing comprising forming one or more components of a semiconductor element, the one or more components of the semiconductor element comprising a stress-inducing region in the recess; and
    relaxing the processing surface after the processing.

2. The method of claim 1, further returning the substrate toward a planar surface.

3. The method of claim 1, wherein the curving comprises forming a convex processing surface.

4. The method of claim 1, wherein the curving comprises forming a concave processing surface.

5. The method of claim 1, wherein the processing comprises forming a silicide.

6. The method of claim 1, wherein the processing comprises forming a stress memorization layer.

7. The method of claim 1, wherein the processing comprises forming source/drain regions.

8. The method of claim 1, wherein the processing comprises forming a channel region.

9. A method of forming a semiconductor structure, the method comprising:
    providing a substrate comprising a processing surface, the processing surface having a first curvature;
    forming a recess in the processing surface of the substrate;
    placing the substrate in a holder, the holder configured to maintain the substrate such that the processing surface exhibits a second curvature, the second curvature having a smaller radius than the first curvature;
    performing one or more process steps on the processing surface of the substrate, the one or more process steps being performed while the processing surface exhibits the second curvature, the one or more process steps comprising forming a material in the recess, the material having a different lattice constant than the substrate;
    removing the substrate from the holder, wherein upon removing the processing surface of the substrate exhibits a third curvature, the third curvature having a greater radius than the second curvature; and
    performing one or more additional processes on the substrate after removing the substrate from the holder.

10. The method of claim 9, further wherein the third curvature is about the same as the first curvature.

11. The method of claim 9, wherein the second curvature has a radius of about 100 m.

12. The method of claim 9, wherein the one or more process steps comprises epitaxially growing a layer.

13. The method of claim 9, wherein the one or more process steps comprises forming a stress memorization layer.

14. The method of claim 9, wherein the one or more process steps comprises forming a silicide layer.

15. A method of forming a semiconductor structure, the method comprising:
    providing a substrate comprising a first material;
    forming a recess in a processing surface of the substrate;
    curving the processing surface of the substrate;
    processing the substrate while the processing surface is curved, wherein the processing comprises forming a second material in the recess; and
    relaxing the processing surface of the substrate.

16. The method of claim 15, wherein the curving comprises forming a convex processing surface.

17. The method of claim 15, wherein the curving comprises forming a concave processing surface.

18. The method of claim 15, wherein the second curvature has a radius of about 100 m.

19. The method of claim 15, wherein the epitaxially growing one or more layers comprises epitaxially growing a stress memorization layer.

20. The method of claim 15, wherein the one or more layers are formed in a recess in the processing surface of the substrate.

* * * * *